(12) United States Patent
Smythe et al.

(10) Patent No.: US 8,129,289 B2
(45) Date of Patent: Mar. 6, 2012

(54) METHOD TO DEPOSIT CONFORMAL LOW TEMPERATURE SIO2

(75) Inventors: John A. Smythe, Boise, ID (US);
Gurtej S. Sandhu, Boise, ID (US);
Brian J. Coppa, Boise, ID (US); Shyam Surthi, Boise, ID (US); Shuang Meng, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 977 days.

(21) Appl. No.: 11/543,515

(22) Filed: Oct. 5, 2006

(65) Prior Publication Data
US 2008/0085612 A1 Apr. 10, 2008

(51) Int. Cl.
*H01L 21/00* (2006.01)
(52) U.S. Cl. .......... 438/787; 438/778; 257/E21.24
(58) Field of Classification Search .......... 438/778, 438/787; 257/E21.24
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,508,579 A | 4/1985 | Goth et al. | |
| 4,648,937 A | 3/1987 | Ogura et al. | |
| 4,716,131 A | 12/1987 | Okazawa et al. | |
| 4,776,922 A | 10/1988 | Bhattacharyya et al. | |
| 4,838,991 A | 6/1989 | Cote et al. | |
| 5,053,105 A | 10/1991 | Fox, III | |
| 5,117,027 A | 5/1992 | Bernhardt et al. | |
| 5,328,810 A | 7/1994 | Lowrey et al. | 430/313 |
| 5,330,879 A | 7/1994 | Dennison | |
| 5,514,885 A | 5/1996 | Myrick | |
| 5,670,794 A | 9/1997 | Manning | |
| 5,753,546 A | 5/1998 | Koh et al. | |
| 5,795,830 A | 8/1998 | Cronin et al. | |
| 5,998,256 A | 12/1999 | Juengling | |
| 6,004,862 A | 12/1999 | Kim et al. | |
| 6,010,946 A | 1/2000 | Hisamune et al. | |
| 6,042,998 A | 3/2000 | Brueck et al. | |
| 6,063,688 A | 5/2000 | Doyle et al. | |
| 6,071,789 A | 6/2000 | Yang et al. | |
| 6,090,442 A | 7/2000 | Klaus et al. | |

(Continued)

FOREIGN PATENT DOCUMENTS

DE    4236609 A1    5/1994

(Continued)

OTHER PUBLICATIONS

International Search Report mailed Jan. 20, 2009 for PCT Application No. PCT/US2007/020687.

(Continued)

*Primary Examiner* — Thanhha Pham
(74) *Attorney, Agent, or Firm* — Michael E. Romani

(57) ABSTRACT

Methods of controlling critical dimensions of reduced-sized features during semiconductor fabrication through pitch multiplication are disclosed. Pitch multiplication is accomplished by patterning mask structures via conventional photoresist techniques and subsequently transferring the pattern to a sacrificial material. Spacer regions are then formed on the vertical surfaces of the transferred pattern following the deposition of a conformal material via atomic layer deposition. The spacer regions, and therefore the reduced features, are then transferred to a semiconductor substrate.

22 Claims, 11 Drawing Sheets

U.S. PATENT DOCUMENTS

| | | | |
|---|---|---|---|
| 6,211,044 B1 | 4/2001 | Xiang et al. | |
| 6,291,334 B1 | 9/2001 | Somekh | |
| 6,297,554 B1 | 10/2001 | Lin | |
| 6,348,380 B1 | 2/2002 | Weimer et al. | |
| 6,362,057 B1 | 3/2002 | Taylor, Jr. et al. | |
| 6,383,907 B1 | 5/2002 | Hasegawa et al. | |
| 6,395,613 B1 | 5/2002 | Juengling | |
| 6,423,474 B1 | 7/2002 | Holscher | |
| 6,455,372 B1 | 9/2002 | Weimer | |
| 6,522,584 B1 | 2/2003 | Chen et al. | |
| 6,548,396 B2 | 4/2003 | Naik et al. | |
| 6,566,280 B1 | 5/2003 | Meagley et al. | |
| 6,573,030 B1 | 6/2003 | Fairbairn et al. | |
| 6,602,779 B1 | 8/2003 | Li et al. | |
| 6,632,741 B1 | 10/2003 | Clevenger et al. | |
| 6,689,695 B1 | 2/2004 | Lui et al. | |
| 6,706,571 B1 | 3/2004 | Yu et al. | |
| 6,709,807 B2 | 3/2004 | Hallock et al. | |
| 6,734,107 B2 | 5/2004 | Lai et al. | |
| 6,744,094 B2 | 6/2004 | Forbes | |
| 6,818,250 B2 | 11/2004 | George et al. | 427/255.15 |
| 6,875,703 B1 | 4/2005 | Furukawa et al. | |
| 6,893,972 B2 | 5/2005 | Rottstegge et al. | |
| 6,962,867 B2 | 11/2005 | Jackson et al. | |
| 6,992,019 B2 | 1/2006 | Lee et al. | 438/763 |
| 7,084,076 B2 | 8/2006 | Park et al. | |
| 2002/0042198 A1 | 4/2002 | Bjarnason et al. | |
| 2002/0045308 A1 | 4/2002 | Juengling | |
| 2002/0063110 A1 | 5/2002 | Cantell et al. | |
| 2002/0127810 A1 | 9/2002 | Nakamura | |
| 2003/0006410 A1 | 1/2003 | Doyle | |
| 2003/0044722 A1 | 3/2003 | Hsu et al. | |
| 2003/0119307 A1 | 6/2003 | Bekiaris et al. | |
| 2003/0127426 A1 | 7/2003 | Chang et al. | |
| 2003/0157436 A1 | 8/2003 | Manger et al. | |
| 2003/0207207 A1 | 11/2003 | Li | |
| 2003/0207584 A1 | 11/2003 | Sivakumar et al. | |
| 2003/0230234 A1 | 12/2003 | Nam et al. | |
| 2004/0000534 A1 | 1/2004 | Lipinski | |
| 2004/0018694 A1* | 1/2004 | Lee et al. | 438/400 |
| 2004/0018738 A1 | 1/2004 | Liu | |
| 2004/0023502 A1 | 2/2004 | Tzou et al. | |
| 2004/0029052 A1* | 2/2004 | Park et al. | 430/314 |
| 2004/0079988 A1 | 4/2004 | Harari | |
| 2004/0106257 A1 | 6/2004 | Okamura et al. | |
| 2004/0222490 A1* | 11/2004 | Raaijmakers et al. | 257/510 |
| 2004/0235255 A1 | 11/2004 | Tanaka et al. | |
| 2005/0186705 A1 | 8/2005 | Jackson et al. | |
| 2006/0046200 A1 | 3/2006 | Abatchev et al. | |
| 2006/0046201 A1 | 3/2006 | Sandhu et al. | |
| 2006/0046422 A1 | 3/2006 | Tran et al. | |
| 2006/0046484 A1* | 3/2006 | Abatchev et al. | 438/689 |
| 2006/0211260 A1 | 9/2006 | Tran et al. | |
| 2006/0216923 A1 | 9/2006 | Tan et al. | |
| 2006/0263699 A1 | 11/2006 | Abatchev et al. | |
| 2006/0267075 A1 | 11/2006 | Sandhu et al. | |
| 2006/0273456 A1 | 12/2006 | Sant et al. | |
| 2006/0281266 A1 | 12/2006 | Wells | |
| 2007/0026672 A1 | 2/2007 | Tang et al. | |
| 2007/0045712 A1 | 3/2007 | Haller et al. | |
| 2007/0048674 A1 | 3/2007 | Wells | |
| 2007/0049011 A1 | 3/2007 | Tran | |
| 2007/0049030 A1 | 3/2007 | Sandhu et al. | |
| 2007/0049032 A1 | 3/2007 | Abatchev et al. | |
| 2007/0049035 A1 | 3/2007 | Tran | |
| 2007/0049040 A1 | 3/2007 | Bai et al. | |
| 2007/0050748 A1 | 3/2007 | Juengling | |

FOREIGN PATENT DOCUMENTS

| | | |
|---|---|---|
| EP | 0227303 A2 | 7/1987 |
| EP | 0491408 A2 | 6/1992 |
| EP | 1357433 A2 | 10/2003 |
| JP | 05343370 | 12/1993 |
| JP | H8-55908 | 2/1996 |
| JP | H8-55920 | 2/1996 |
| WO | WO 02099864 | 12/2002 |
| WO | WO 2004001799 A2 | 12/2003 |
| WO | WO 2004003977 | 1/2004 |
| WO | WO 2006026699 A2 | 3/2006 |

OTHER PUBLICATIONS

Bergeron, et al. Resolution Enhancement Techniques for the 90nm Technology Node and Beyond. Future Fab International, Issue 15, Jul. 11, 2003. 4 pages.

Bhave et al. Developer-soluble gap fill materials for patterning metal trenches in via-first dual damascene process. Proceedings of SPIE: Advances in Resist Technology and Processing XXI, vol. 5376, 2004. 8 pages.

Chung et al. Pattern multiplication method and the uniformity of nanoscale multiple lines. J.Vac. Sci. Technol. B21(4) Jul./Aug. 2003. pp. 1491-1495.

Joubert et al. Nanometer scale linewidth control during etching of polysilicon gates in high-density plasmas. Microelectronic Engineering 69. 2003. pp. 350-357.

Oehrlein et al.Pattern transfer into low dielectric materials by high-density plasma etching. Solid State Tech. May 2000. 8 pages.

U.S. Appl. No. 11/543,515, filed Oct. 24, 2006.

*Ex parte Cantell*, unpublished decision of the Board of Patent appeals and Interferences, Mar. 4, 2005.

U.S. Appl. No. 11/214,544, Aug. 29, 2005, Tran et al.
U.S. Appl. No. 11/215,982, Aug. 31, 2005, Tran, Luan.
U.S. Appl. No. 11/219,067, Sep. 1, 2005, Tran, Luan.

* cited by examiner

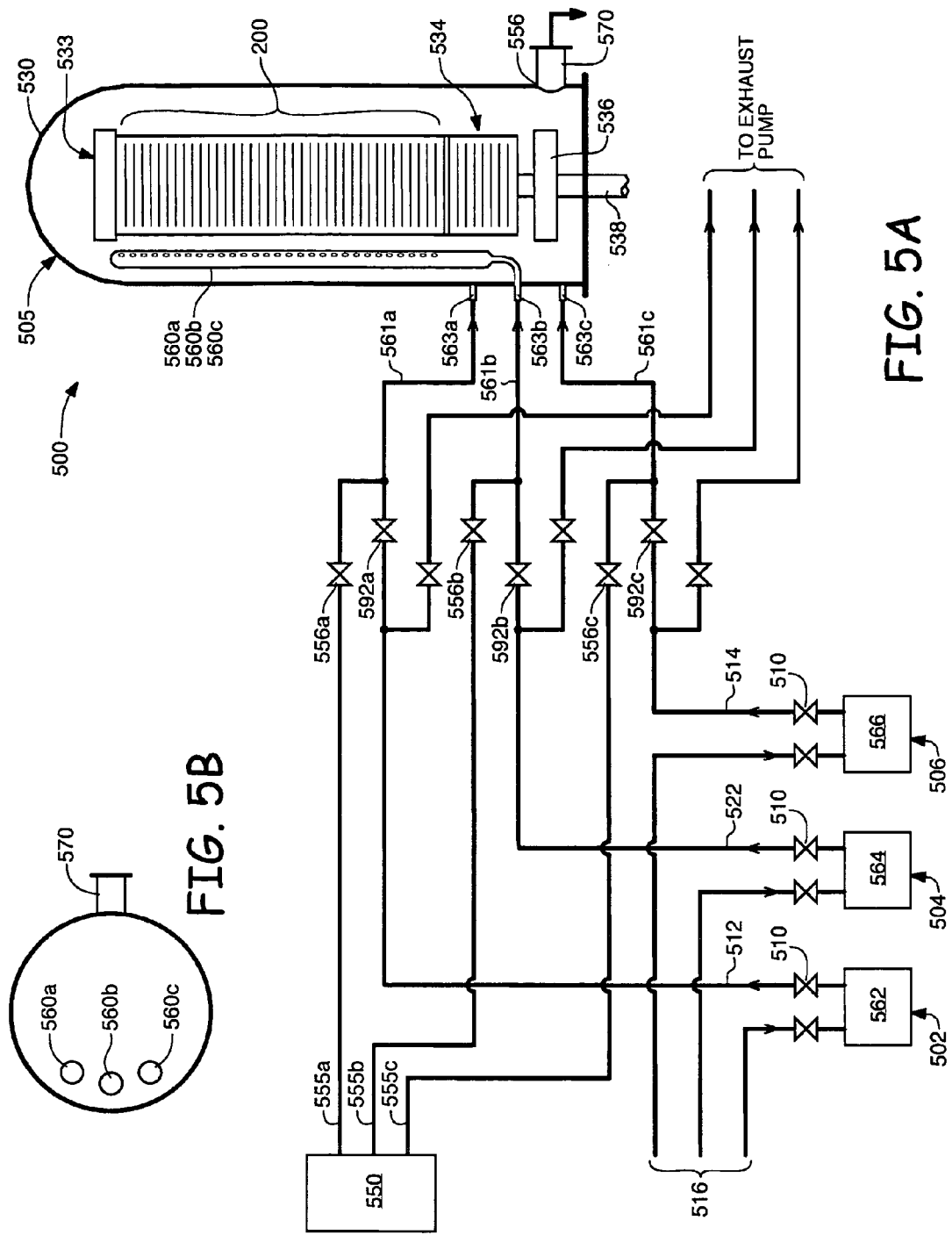

US 8,129,289 B2

METHOD TO DEPOSIT CONFORMAL LOW TEMPERATURE SIO2

CROSS-REFERENCE TO RELATED APPLICATIONS

This application is related to, and incorporates by reference in their entireties, the following: U.S. patent application Ser. No. 11/214,544, Pitched Reduced Patterns Relative to Photolithography Features, to Tran et al., filed 29 Aug. 2005; U.S. patent application Ser. No. 11/219,067, Method of Forming Sub 50 NM Contact Size Using 248 NM Photolithography, to Tran, filed 1 Sep. 2005; U.S. patent application Ser. No. 11/215,982, Methods of Forming Pitch Multiplied Contacts, to Tran, filed Aug. 31, 2005.

FIELD OF THE INVENTION

This disclosure relates generally to integrated circuits and, more particularly, to photolithography process.

BACKGROUND OF THE INVENTION

Although the reasons are numerous, including increased energy efficiency and capacity, it has become necessary to manufacture integrated circuits continuously smaller and with denser feature profiles. It is necessary, therefore, that the constituent features that form the integrated circuit, e.g., interconnect lines and electrical devices, also continue to decrease in size to accommodate these continuing demands. This trend of decreasing feature size is evident, for example, in memory circuits and devices such as dynamic random access memory ("DRAM"), logic gate arrays and non-volatile memory devices such as flash memory.

As an example, a DRAM device can comprise millions of identical circuit elements known as memory cells. Each memory cell may include two electrical devices, a storage capacitor and an access field effect transistor. Each memory cell is an addressable location that can store one binary bit of data. A bit of data can be written to a memory cell through the access transistor and read by sensing charge on the storage capacitor. In another example, flash memory cells contain floating gate field effect transistors capable of holding a charge. Flash memory cell data is determined by the presence or absence of a charge on the floating gate. Flash memory cells may be arranged in different architecture configurations, such as either a "NOR" architecture where each memory cell is coupled with a bit line or a "NAND" architecture where memory cells are aligned in a "string" of cells such that activation of the entire bit line is necessary for access of the data.

As is evident from the above examples, memory devices typically include large patterns or arrays of electrical devices and device interconnecting conductors. As these features continue to decrease in size, increasingly greater demands are placed on the manufacturing techniques used to form these features. Features are commonly defined using the term "pitch," where the pitch of a pattern is the distance between two identical points within a repeating pattern, such as features in arrays. Thus, pitch can be described as the sum of the width of a feature and the width of the neighboring space on one side of the feature which separates the feature from the nearest neighboring feature.

In integrated circuits, the smallest or minimum feature dimension of a particular circuit design or masking scheme, such as a word line, is known as the critical dimension ("CD"). The CD can be described as the pitch or the measurement of the smallest feature capable of being formed by the design or scheme. For instance, with the continued scaling of flash memory technology, controlling the CD of certain structures during fabrication, such as shallow trench isolation ("STI") structures, is critical to this continued scaling. As these device elements are reduced in size, the difficulty of patterning them increases.

One of the primary methods of patterning features during integrated circuit manufacture is photolithography. However, photolithography techniques have inherent limitations due to optical and radiation wave length characteristics such that these limitations inhibit the use of photolithography to directly form the reduced features. For example, certain photoresist materials act in response to particular wavelengths of light. This selectivity to specific light wavelengths limits individual photolithography methods to a minimum pitch below which each particular photolithography technique can not reliably form features. As such, the pitch capable of being produced through photolithography becomes an impediment to continuous feature size reduction.

One method of reducing the pitch size, and thereby extending the present capabilities of photolithography, is know as pitch doubling or pitch multiplication (see e.g., U.S. Pat. No. 5,328,810 issued to Lowery et. al.). During this process, the pitch is actually decreased, thereby increasing the number of features which can be fabricated in a given area. One technique used to multiply pitch is to use features such as side wall spacers to create smaller patterns than present lithography techniques are capable of producing.

Accordingly, there is a need for methods for operational control of critical dimension and process variations during size-reduced feature fabrication in integrated circuit production.

BRIEF DESCRIPTION OF THE DRAWINGS

FIG. 5A is a simplified schematic representation of an ALD process reaction chamber and associated apparatus which can be used to deposit a conformal material according to embodiments of the invention.

FIG. 5B is a simplified schematic top view of a reaction chamber which can be used with an ALD process according to embodiments of the invention.

It should be emphasized that the drawings herein may not be to exact scale and are schematic representations. The drawings are not intended to portray the specific parameters, materials, particular uses, or the structural details embodiments of the invention.

DETAILED DESCRIPTION OF THE ILLUSTRATED EMBODIMENTS

Embodiments of the present invention provide methods for control of critical dimensions during the fabrication of pitch reduced features in semiconductor production through the formation of a highly conformal silicon oxide material by an atomic layer deposition process. The methods may provide uniformity of a silicon dioxide material within a wafer, wafer to wafer, and run to run and may provide for improved operational control during manufacturing to help ensure repeatability of reduced size feature fabrication.

Figure 1A:
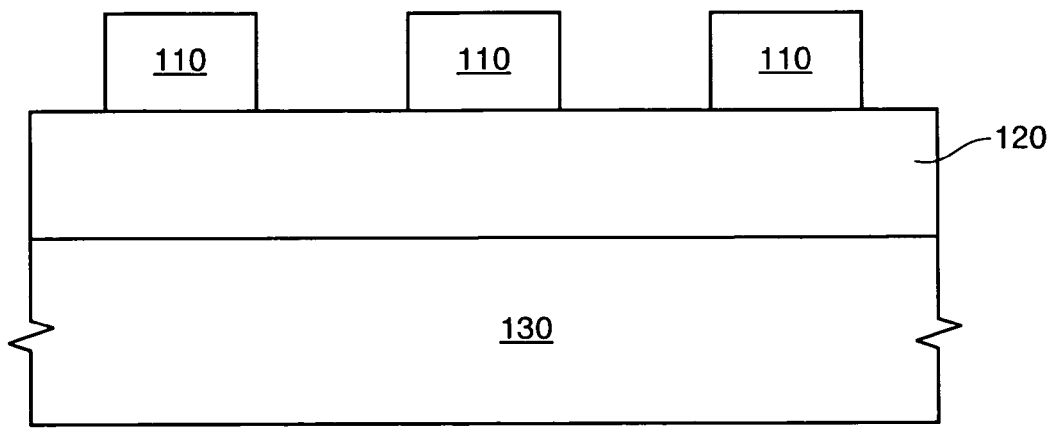
FIGS. 1A-F are schematic cross-sectional views of a sequence of masking patterns for forming size-reduced features in accord with prior art pitch multiplication.
Figure 1B:
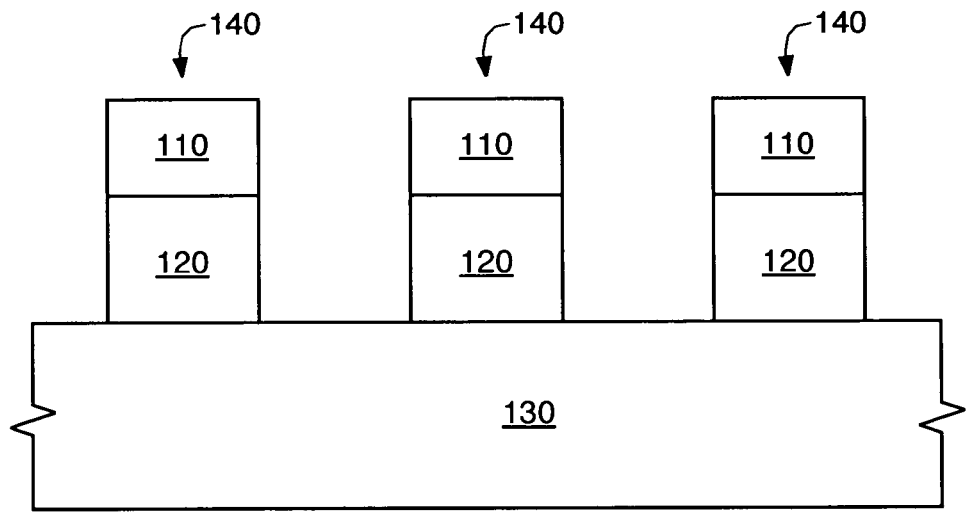
Figure 1C:
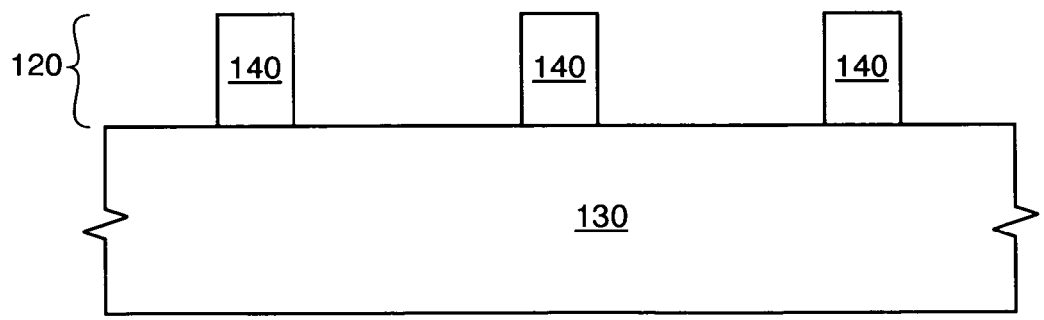
Figure 1D:
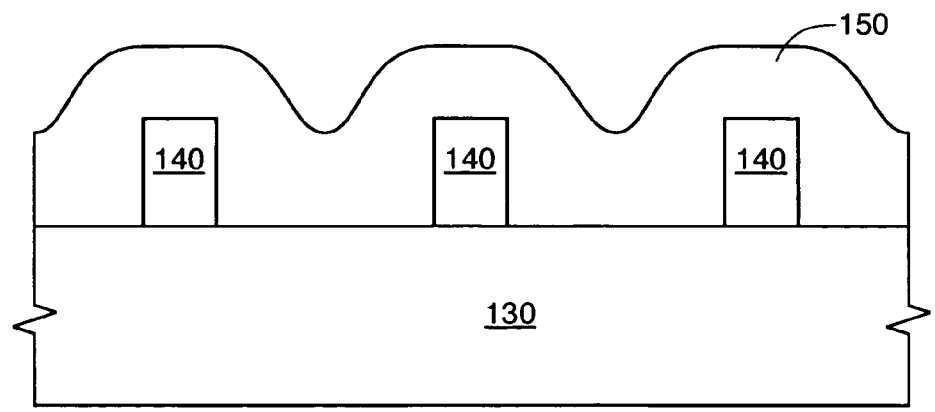
Figure 1E:
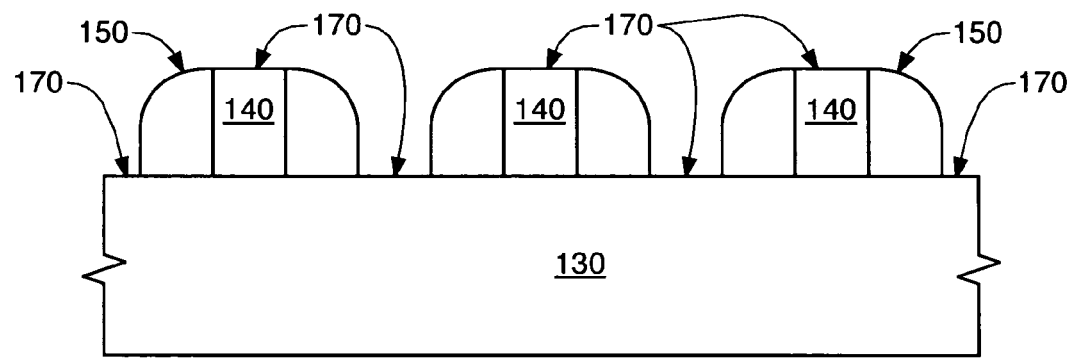
Figure 1F:
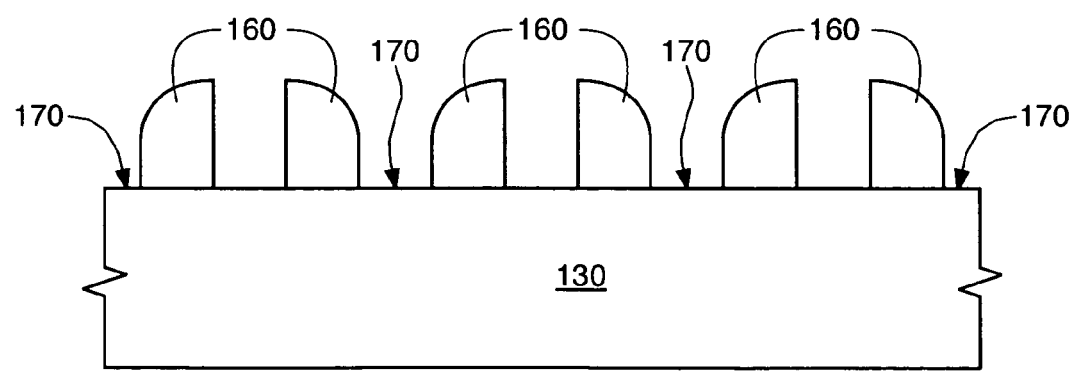

Pitch doubling or pitch multiplication is a common method for extending the capabilities of current photolithographic techniques beyond their inherent limitations. FIGS. 1A-F are representative illustrations of a prior art pitch multiplication method as described in U.S. Pat. No. 5,283,810, issued to Lowery, et al. Referring to FIG. 1A, a plurality of resist lines 110 are formed via photolithography in a photoresist material on a sacrificial material 120, adjacent to a substrate 130. As illustrated in FIG. 1B, mask structures 140 are formed following etching of the sacrificial material 120. In FIG. 1C, resist lines 110 have been removed via commonly known techniques and the width of the mask structures 140 may have been reduced in size in the etch step. A spacer material 150 is then deposited over mask structures 140, as illustrated in FIG. 1D. In FIG. 1E, the spacer material is subjected to a directional etch step which removes the material from the horizontal surfaces 170. FIG. 1F shows that the mask structures 140 are then removed, forming spacers 160, which will subsequently act as a mask for patterning the size-reduced features.

Pitch doubling techniques are known to present operational difficulties in transferring the reduced features to the integrated circuit substrate. For example, such difficulties can be caused by the inability to control certain critical dimensions during the fabrication of the pitch reducing features, including the width of the spacer material used to create pitch doubling features. For instance, methods of forming spacer material and thereby the reduced features, such as chemical vapor deposition ("CVD") techniques, do not provide sufficient operational control during manufacturing. Rather, such techniques can introduce process variations that may be detrimental to the repeatability of size-reduced integrated circuit features during fabrication, for example the inability to control the uniformity of the deposited film during fabrication. This lack of operation control can affect the fabrication of the semiconductor in several ways, including process variations within wafer, wafer to wafer and run to run.

Atomic layer deposition ("ALD") techniques are currently better situated to provide the sought after operational control of spacer size in pitch multiplication techniques. However, ALD techniques have process characteristics, such as temperature and pressure requirements, which are in and of themselves detrimental to size-reduced feature fabrication. For example, process temperatures may exceed the decomposition temperatures of sacrificial materials, such as hard mask materials, causing the material to breakdown during fabrication. This may cause unacceptable variations in spacer material deposition thickness. Thus, these process limitations make consistent and repetitious pitch multiplication in integrated circuit manufacture difficult.

In accordance with the foregoing, an improved method has been developed to provide the manufacturer improved operational control over reduced size feature fabrication through the use of pitch doubling techniques.

As will be appreciated, as used herein, "conformal" or "uniform" generally refers to a ratio of horizontal surface film thickness to vertical surface film thickness during the atomic layer deposition process. As a reference, a deposition process that is perfectly conformal will have a 1:1 ratio of horizontal surface film thickness to vertical surface film thickness. That is, the film will be deposited on the horizontal surfaces at the same rate that the film is deposited on the vertical surfaces. It will be appreciated that as used herein, a conformal material may have a thickness variation from a range of about 1% to about 4%. As explained herein, a conformal layer provides the improved operational control to ensure pitch reduced feature critical dimensions are able to be repeatedly reproduced during the semiconductor manufacturing process.

Additionally, the terms "semiconductor substrate," "substrate" or "wafer" are interchangeable and defined to mean any material comprising a semiconductive material, including, but not limited to, a semiconductive wafer either alone or in assembly with other materials on or within the semiconductive material.

Figure 2A:
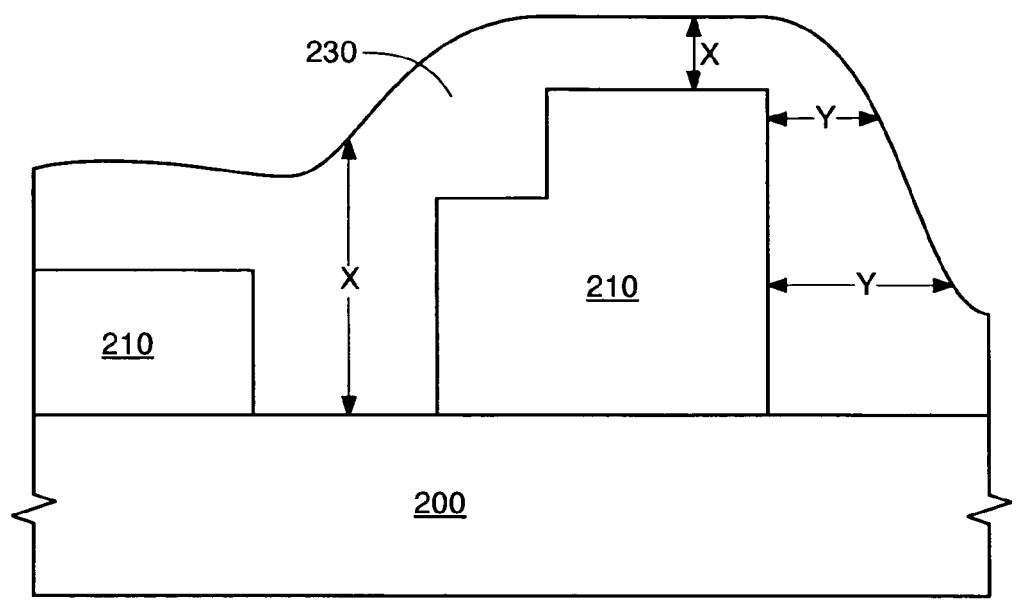
FIG. 2A is a cross sectional view of a material deposited by a prior art chemical vapor deposition process.

Referring now to FIG. 2A, a cross section of an in-process semiconductor 200 exposed to a prior art CVD process is shown. Mask structure 210 is shown extending in an upward direction in an essentially vertical alignment from the semiconductor 200. A non-conformal CVD deposit 230 is shown deposited adjacent to the mask structure 210. Dimensions x and y of the non-conformal CVD deposit 230 typically are not uniform or approaching equivalency in thickness. Because conformality of CVD deposits are highly sensitive to pattern density and aspect ration, uniformity is not consistent within wafer, wafer to wafer, or run to run, resulting in decreased operational control of spacer material dimension during fabrication and, therefore, decreased control of CD during pitch doubling procedures for the fabrication of reduced size features.

Figure 2B:
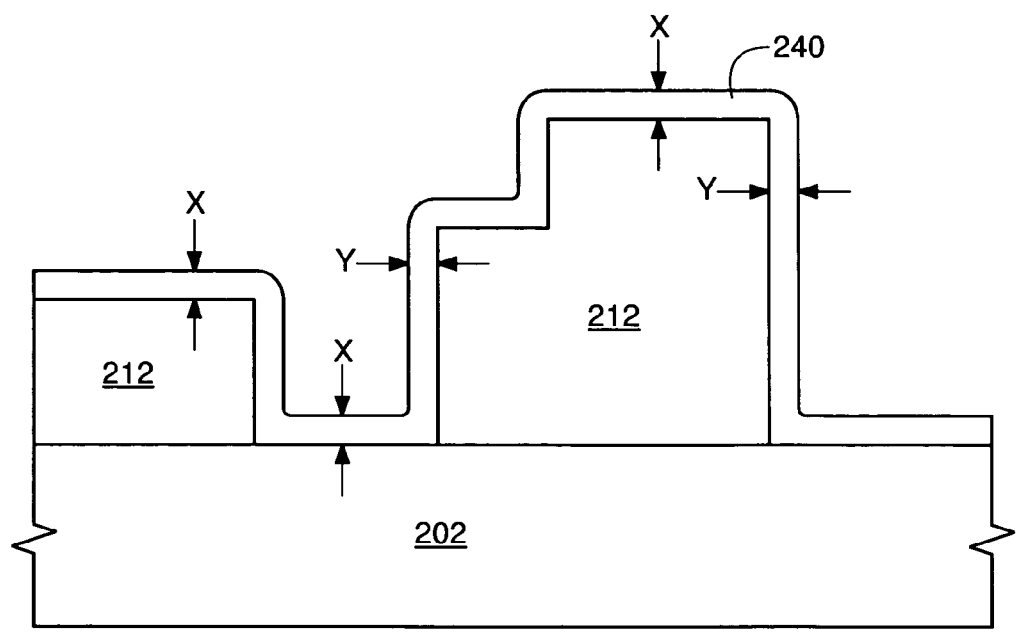
FIG. 2B is a cross sectional view of a conformal material deposited by the disclosed ALD process according to embodiments of the invention.

As illustrated in FIG. 2B, a cross section of an embodiment of an in-process semiconductor 202 exposed to an ALD process of one embodiment is shown. A conformal ALD deposited layer 240 is shown adjacent to mask structures 212. Dimensions x and y are conformal and the variation in thickness within wafer, wafer to wafer or run to run is from about 1% to about 4%. This high degree of uniformity is independent of pattern loading effect, i.e. not dependent on the density of features, and allows for substantial control of feature CD during pitch doubling procedures for reduced size feature fabrication.

Figure 3:
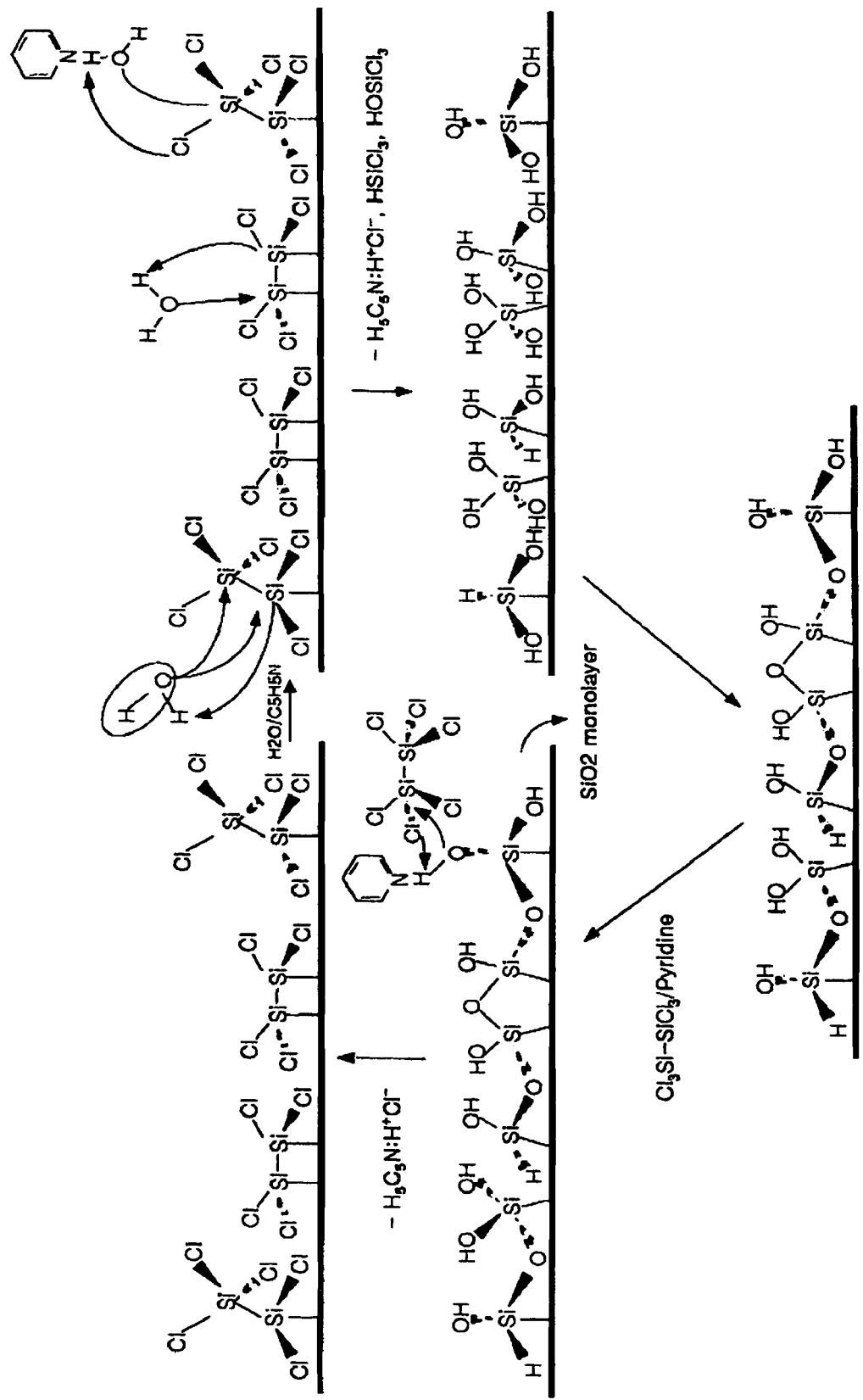
FIG. 3 is a prior art representation of the theorized reaction steps underlying the chemistry upon which the improved ALD methods of embodiments of the invention are based.

According to one embodiment, an in-process semiconductor substrate is subjected to an ALD process to form a conformal silicon dioxide material on a substrate, for example in memory device fabrication. The surface of the substrate is likely functionalized with a hydroxyl group. As illustrated in the theorized reaction of FIG. 3, the silicon dioxide is grown on the functionalized substrate surface by exposing the substrate surface to a first mixture comprising a silicon-halide compound comprising at least two silicon atoms, for example hexachlorodisilane ("HCD") and a heterocyclic aromatic organic compound, such as pyridine. Following removal of the first mixture, the substrate surface is exposed to a second mixture comprising a compound containing oxygen and hydrogen, for example water and a heterocyclic aromatic organic compound, such as pyridine. By exposing the functionalized substrate surface to the first mixture, pyridine generates hydrogen bonding with the silicon hydroxide on the substrate surface resulting in a weakening of the SiO—H bond, thereby increasing the nucleophilicity of the oxygen atom for reaction with the electron deficient silicon in the HCD, creating a silicon dichloride molecule on the surface of the substrate. Upon introduction of the second mixture, the pyridine generates hydrogen bonding with the water causing the oxygen atom in the water molecule to become more nucleophilic for reaction with the electron deficient silicon dichloride molecule. This initiates a weakening of the Si—Cl bond causing a titration of the chlorine ion(s) by an OH ion, resulting in a monolayer of silicon dioxide on the substrate surface. Alternatively, the introduction of the second mixture causes the direct interaction of the nitrogen ion of the pyridine with the electron deficient surface silicon atoms, weakening the Si—Cl bond, resulting in a titration of the chlorine ion by the hydroxyl group. It will be appreciated that the present invention is not bound or limited by the theorized reaction.

To form the silicon dioxide, the functionalized substrate is placed in a reaction chamber of an ALD furnace and is subjected to an ALD process described below. The conformal silicon dioxide is deposited on the semiconductor substrate through repetitive ALD cycles, where each cycle deposits a monolayer of silicon dioxide. The thickness of the silicon dioxide is achieved by exposing the substrate through multiple, repetitious ALD cycles. The temperature of the ALD process is selected such that the sacrificial material is not consumed by the ALD process, which allows for increased control over the CD during reduced size feature fabrication. Additionally, the temperature allows for a higher rate of deposition and high silicon dioxide uniformity within each wafer, wafer to wafer and run to run for each completed cycle.

Figure 4:
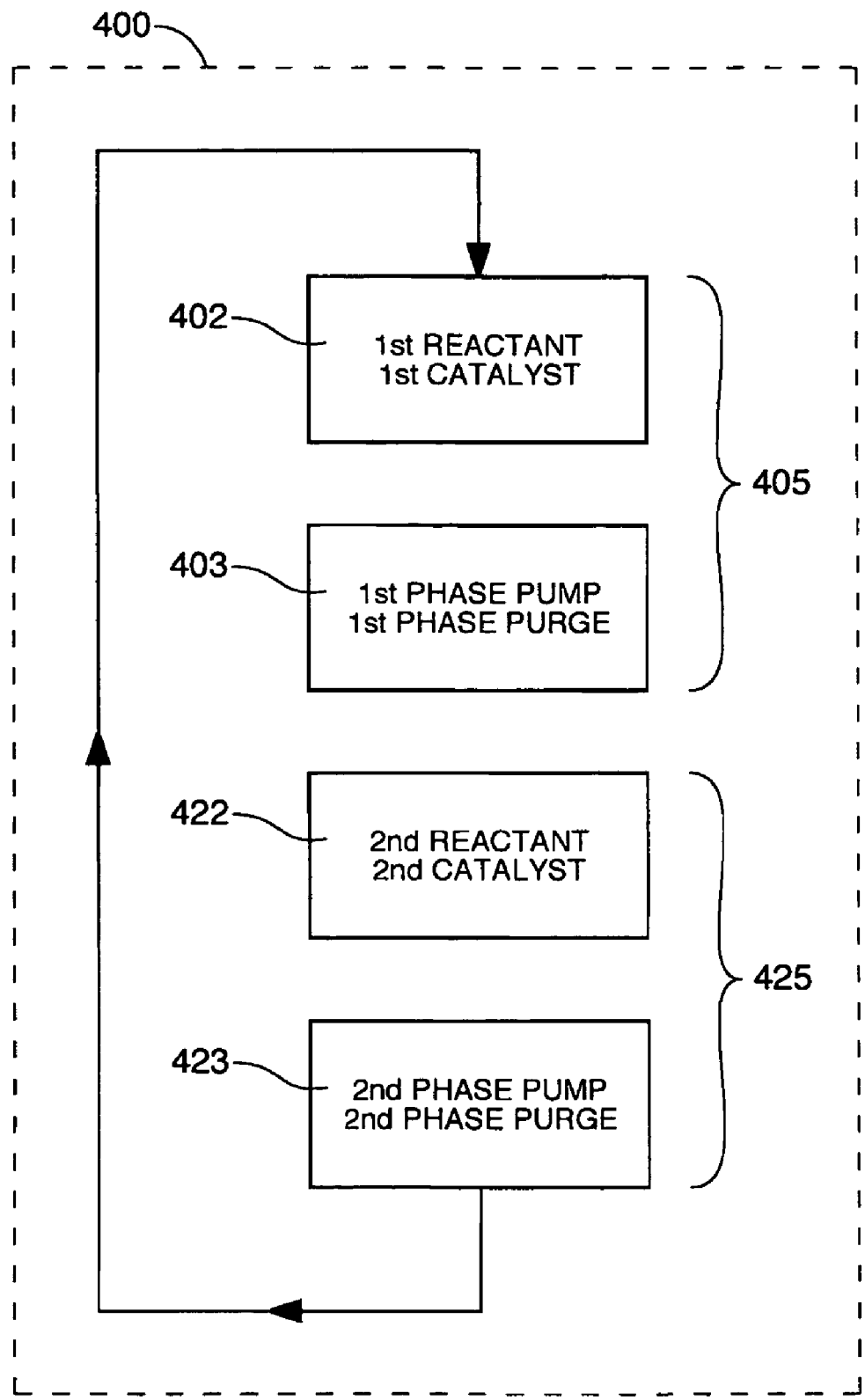
FIG. 4 is a flow chart schematically illustrating the steps of an embodiment of a disclosed ALD method.

In accordance with an embodiment of the instant invention, FIG. 4 shows a flow chart that illustrates steps that apply to the methods of the disclosed ALD process for forming the conformal silicon dioxide material on a semiconductor substrate. One cycle of the ALD process 400 comprises two phases. The first phase 405 comprises two sub-steps, the introduction of the first mixture 402 into the reaction chamber and a pump/purge cycle 403 for the removal of excess first mixture 402 from a reaction chamber. During the first phase 405, a first mixture 402 comprising a first reactant and a first catalyst are introduced into the reaction chamber. The first reactant, a silicon-halide compound comprising at least two silicon atoms, for example hexachlorodisilane ("HCD"), is pulsed into the reaction chamber. The first catalyst, a heterocyclic aromatic organic compound, such as pyridine, is pulsed into the reaction chamber substantially at the same time as the first reactant. The first phase 405 of the ALD process is completed upon the pump/purge cycle 403 of first mixture 402 from the reaction chamber. The pump/purge cycle removes unreacted first mixture from the reaction chamber between pulses of mixtures and prepares the reaction chamber for the next phase of the ALD cycle.

The second phase 425 of the disclosed ALD process also comprises two sub-steps, the introduction of the second mixture 422 and a pump/purge cycle 423 for the removal of the excess second mixture 422 and preparation of the reaction chamber for a subsequent ALD cycle, if required. Second phase 425 begins with the introduction of a second mixture 422 into the reaction chamber. Second mixture 422 comprises a second reactant and second catalyst. Second reactant is a compound containing oxygen and hydrogen, for example water, and the second catalyst is a heterocyclic aromatic organic compound, such as pyridine. The second reactant and second catalyst are pulsed into the reaction chamber substantially simultaneously. The second phase 425 is completed upon the pump/purge cycle 423 of second mixture 422 from the reaction chamber. Phase one 405 and phase two 425 make up one ALD cycle and are repeated until the desired deposition thickness is attained.

In practicing the described embodiments, the conditions in the reaction chamber are preferentially set to avoid the consumption of the sacrificial material and maintain a high deposition rate of the silicon dioxide. With reference to FIG. 5A, prior to the initiation of the ALD process, temperature inside the reaction chamber 505 is stabilized to the temperature of the process, from a range of about 20 to 90 degrees C., and more particularly in one embodiment to a temperature in the range of 65 to 80 degrees C., such as 75 degrees C., may be useful. Additionally, the first reactant, second reactant and first and second catalyst can be stored in containers, more particularly ampoules, associated with the ALD furnace. The first reactant ampoule 502 is maintained at a temperature in a range from about 10 to 90 degrees C., and more particularly in one embodiment to a temperature in the range of about 20 to 60 degrees C., such as 39 degrees C., may be useful. The second reactant ampoule 504 is maintained at a temperature in a range from about 10 to 90 degrees C., and more particularly in one embodiment to a temperature in the range of about 20 to 50 degrees C., such as 20 degrees C. may be useful. The first and second catalyst ampoule 506 is maintained at a temperature in a range from about 10 to 90 degrees C., and more particularly in one embodiment to a temperature in the range of about 20 to 60 degrees C., such as 20 degrees C., may be useful The ALD cycle can begin by opening valves 510 and charging of a first reactant supply line 512 with HCD and first and second catalyst supply line 514 with pyridine for a time of approximately 2 to 6 seconds, and more particularly in one embodiment to 4 seconds. An inert gas may be used as a carrier for all supply lines. If a carrier gas is utilized, nitrogen may be a useful carrier gas and is supplied to the ampoules 502, 504, and 506 through carrier gas supply lines 516. Alternatively, supply lines can be charged with the vapor pressure supplied from the ampoules of the various reactants and catalysts. The first mixture 402 is then pulsed into the reaction chamber 505 for approximately 2 to 60 seconds, and more particularly, for approximately 10 seconds. Pressure is set at this time for the first mixture pulse from about 100 mtorr to about 400 torr, in one embodiment pressure in the range from about 1 to 20 torr can be used, further, a pressure of 7 torr, may be useful. The pressure of this phase is dynamic and moves within the described range during the pulse. A initial first phase mixture pump out of reaction chamber 505 occurs for a period of 2 to 60 seconds, in one embodiment for a period of 3 to 10 seconds. An initial first phase reaction chamber purge is then performed with a purge gas 550 for approximately 2 to 60 seconds, for example in one embodiment for a period of 3 to 10 seconds. Purge gas 550 is flowed at a rate of approximately 0.3 slm to 5 slm, and in one embodiment a rate of 3 slm may be useful. An additional first phase mixture pump out followed by an additional first phase reaction chamber purge is performed according to similar parameters as the initial first phase mixture pump out and initial first phase reaction chamber purge detailed above.

With continued reference to FIG. 5A, the second phase 425 of the ALD cycle begins by opening valves 510 and charging of a second reactant supply line 522 with water and first and second catalyst supply line 514 with pyridine for a time of approximately 2 to 6 seconds, for example in one embodiment 4 seconds. An inert gas may be used as a carrier for all supply lines. If a carrier gas is utilized, nitrogen is the preferred carrier gas and is supplied to the ampoules 502, 504, and 506 through carrier gas supply lines 516. Alternatively, supply lines can be charged with the vapor pressure supplied from the ampoules of the various reactants and catalysts. The second mixture 422 is then pulsed into the reaction chamber 505 for approximately 2 to 60 seconds, and for example in one embodiment, a pulse of for approximately 20 seconds may be used. Pressure is set at this time for the first mixture pulse from about 100 mtorr to about 400 torr, for example in one embodiment, pressure in the range from about 1 to 20 torr can be used, further, a pressure of 7 torr, may be useful. Like the first phase 405 of the ALD cycle, the pressure of this second phase 425 is dynamic and moves within the described range during the pulse. An initial second phase mixture pump out of reaction chamber 505 occurs for a period of 2 to 60 seconds, and in one embodiment for a period of 3 to 10 seconds. An initial second phase reaction chamber purge is then performed with a purge gas 550 for approximately 2 to 60 seconds, for example in one embodiment for a period of 3 to 10 seconds. The carrier gas is flowed at a rate of approximately 0.3 slm to 5 slm, and in one embodiment a rate of 3 slm may be useful. An additional second phase mixture pump out followed by an additional second phase reaction chamber purge is performed according to similar parameters as the initial second phase mixture pump out and initial second phase reaction chamber purge detailed above.

The cycle described above for the formation of the conformal silicon dioxide can be formed in a deposition apparatus 500 such as that illustrated in FIG. 5A. Such an apparatus may include a reactor chamber 505, which may be constructed entirely as a quartz container 530. Quartz container 530 may be constructed generally of glass made from high purity quartz crystal or silica sand. The bottom portion of quartz container 530 can also be constructed of a metal, such as stainless steel. Functionalized substrate wafers 200 are placed inside the reaction chamber 505 on a quartz boat 533 which can hold a plurality of substrates 200 and which is immediately adjacent to adiabatic plates 534. Pedestal 536 is adjacent to adiabatic plates 534 and quartz boat 533. Shaft 538 is connected to pedestal 536 and rotates in a counter clockwise rotation by a motor (not shown) during the ALD process. Shaft 538 causes pedestal 536 to rotate in the same direction, resulting in substrate 200 also being rotated in a counter clockwise direction. Mounted on one of the reaction chamber walls are reactive gas supply injectors 560a-c (see FIG. 5B), which are further connected to reactive gas supply lines 561a-c via gas inlet ports 563a-c, each separately supplying the first reactant 562, second reactant 564 or first and second catalyst 566 to the reaction chamber 505. Each gas supply injector 560a-c contain multiple outlet ports, or holes, which run the entire length of the gas supply injector 560a-c, providing substantially equivalent disbursement of the reactant gases within reaction chamber 505 to ensure complete and uniform coverage by the reactants or catalyst on the plurality of substrate 200 located in reaction chamber 505. First reactant 562 is contained in first reactant ampoule 502, second reactant is contained in second reactant ampoule 504 and first and second catalyst is contained in first and second catalyst ampoule 506. Purge gas 550 is supplied to the reaction chamber 505 through purge gas supply lines 555a-c and may be introduced into reaction chamber 505 through inlet ports 563a-c. An exhaust outlet 570, connected to a pump/exhaust system (not shown) is situated on an opposite lower wall 556 from the gas supply injectors 560a-c in reaction chamber 505. Purge gas is controlled by purge gas valves 556a-c. Reactant and catalyst gas is supplied to the reaction chamber 400 via chemical supply lines 512, 522, and 514 and controlled by chemical supply line valves 592a-c.

ALD processes in general possess several known deficiencies that can interfere with fabrication of sublithographic features. Thickness variations caused by variations in the composition and/or surface properties of the underlying substrate is one example of such deficiencies. Such a disadvantage can limit the application of ALD methods in reduced feature fabrication by not providing a material that is sufficiently uniform. For example, when a deposition is performed on a single substrate material having uneven or changing surface properties, materials may be deposited at varying rates because of the topography of the substrate. Additionally, the number or density of features, known as pattern loading, also may contribute to non-conformal deposition of material. These different rates of formation produce defects and/or varying thicknesses in the deposited material which are adverse to pitch reduced feature fabrication. Accordingly, even though ALD may be used to form a conformal material, thickness variations may produce unacceptable defects.

In the disclosed ALD process, such deficiencies are addressed by the disclosed reaction parameters and by alternately exposing the substrate to the first and second reactant gases, allowing for a uniform adsorption of the reactant gases on the wafer surface. This produces a highly conformal deposition at the feature level, within wafer level, wafer to wafer level and run to run level, providing greater control over sublithographic feature fabrication. The disclosed method provides for very small process variation of about 1% to about 4% in deposition material thickness within wafer, wafer to wafer and run to run. This high degree of conformity is independent of substrate surface properties, such as pattern loading, and allows for substantial control of feature CD. In one embodiment the variation can be less than 2%.

Figure 6A:
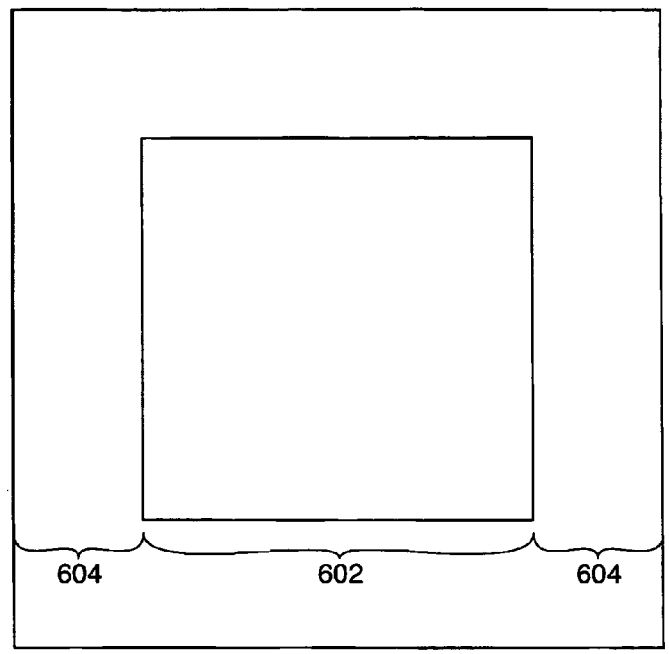
FIGS. 6A and 6B are schematic top and cross-sectional views of an in-process semiconductor according to embodiments of the invention.

Referring now to FIG. 6A, a simplified top view of an in-process integrated circuit 200, for example a memory device, is shown. An array region 602 is encompassed by a periphery region 604. During integrated circuit fabrication, numerous features associated with integrated circuit function, such as transistors and capacitors, will be fabricated into the array region 602. The pitch multiplication technique presently disclosed is particularly advantageous to increasing the density of such features in the array region 602, as compared to the periphery region 604 where conventional photolithography techniques may be sufficient for feature formation. Such features may be larger and/or of more complex geometry in the periphery than those formed in the array region 602.

Figure 6B:
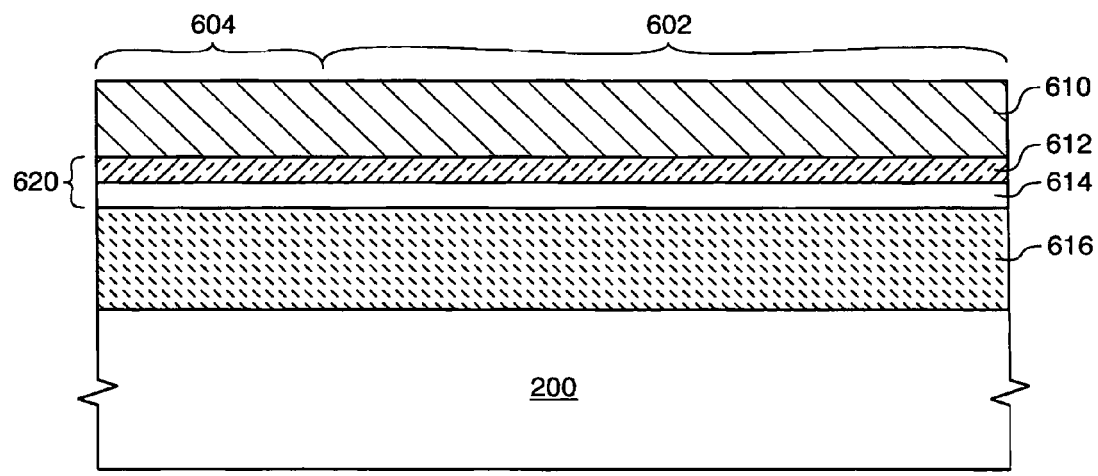

FIG. 6B illustrates a simplified cross-sectional view of an in-process semiconductor substrate 200 of an embodiment of the disclosed invention. A sacrificial mask 610, consisting of a photoresist or other material, for example in one embodiment a transparent carbon material, is deposited adjacent to at least a portion of a hard mask 620. The hard mask can comprise two or more individually deposited materials, such as amorphous silicon 612 and a low silane oxide 614. Mask 610 is from about 800 to 2000 angstroms in thickness, for example in one embodiment 1200 angstrom may be useful. A second mask material 616 located adjacent to at least a portion of hard mask 620 and substrate 200, can comprise a material similar in characteristics to mask 610. In one embodiment, mask material 616 and has a thickness of about 2500 angstroms. Mask materials 610-616 can be formed by using methods known in the art such as spin-on coating, CVD, ALD, plasma enhanced CVD or other methods and selected based upon specific properties related to subsequent etch chemistry, process requirements and subsequent pattern transferring steps described herein. Additionally, because these materials function to transfer specific patterns from mask 610 and eventually to substrate 200, they are utilized in the disclosed process because of their susceptibility to specific etch chemistries, typically CF4 and CHF3.

Figure 7:
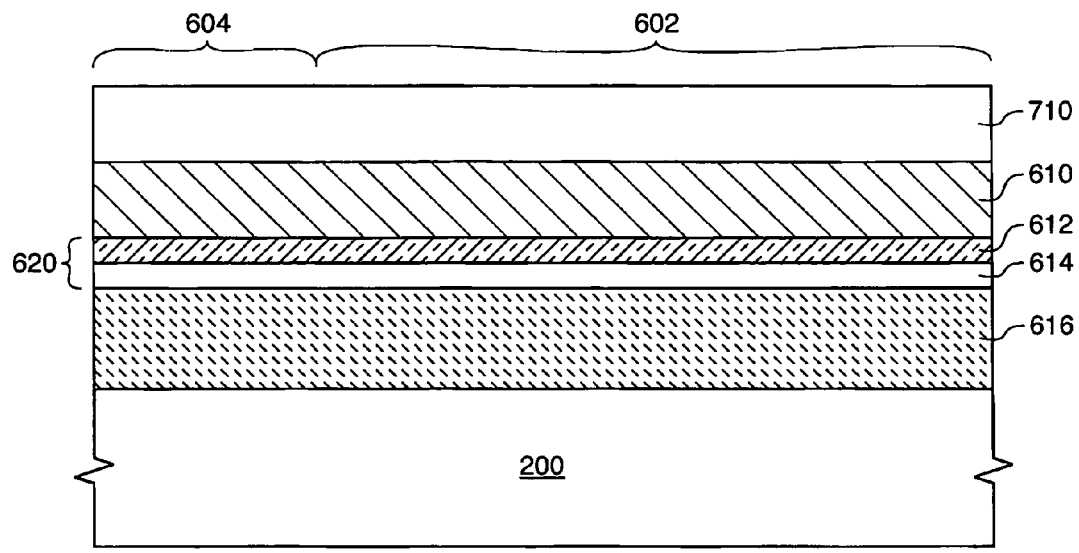
FIG. 7 is a schematic cross-sectional view of the in-process semiconductor of FIGS. 6A and 6B after deposition of a photoresist according to embodiments of the invention.

Referencing now FIG. 7, a photoresist material 710 is deposited adjacent to at least a portion of mask 610. Photoresist 710 can be deposited in any known manner, for example spin-on coating, and can be comprised of any photoresist material known in the art, particularly those materials compatible with lithography techniques using 193 nm and 248 nm wavelengths. In one embodiment photoresists include those sensitive to an argon fluoride used typically with 193 nm photolithography systems and photoresists sensitive to krypton fluoride, typically used with 248 nm photolithography systems. It will be appreciated that the thickness of photoresist 710 will vary depending on the radiation wavelength utilized. Because of limitations inherent in photolithography systems, anti-reflective coatings, such as bottom anti-reflective coating ("BARC"), are known to aid in the formation of features through photolithography near the resolution limits of photolithography techniques. Pitches near the resolution limits of current photolithography techniques may be met with or without the use of anti-reflective coatings, such as BARC, in embodiments of the invention.

Figure 8:
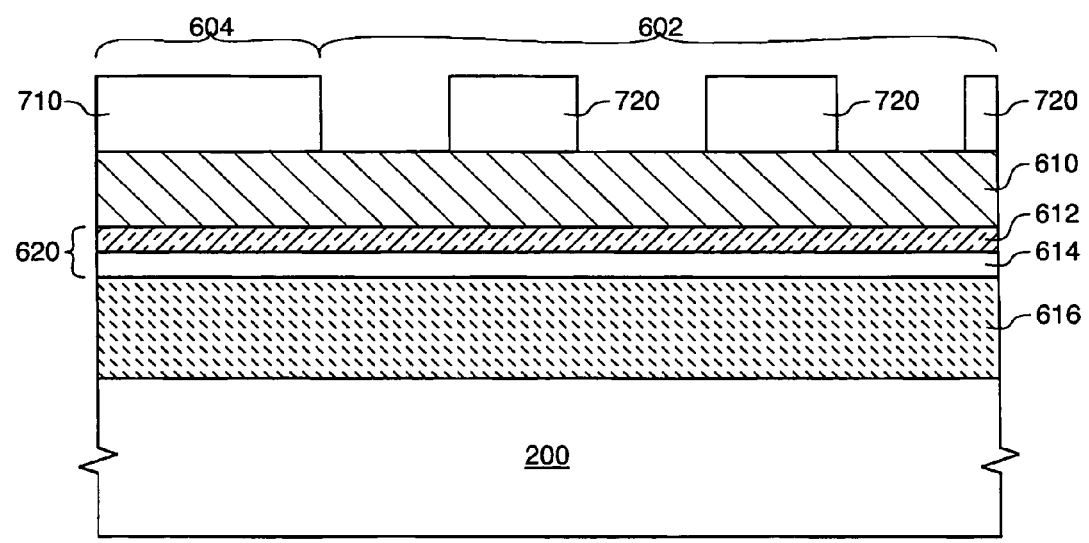
FIG. 8 is a schematic cross-sectional view of the in-process semiconductor of FIG. 7 after forming lines in the photoresist according to embodiments of the invention.
Figure 9:
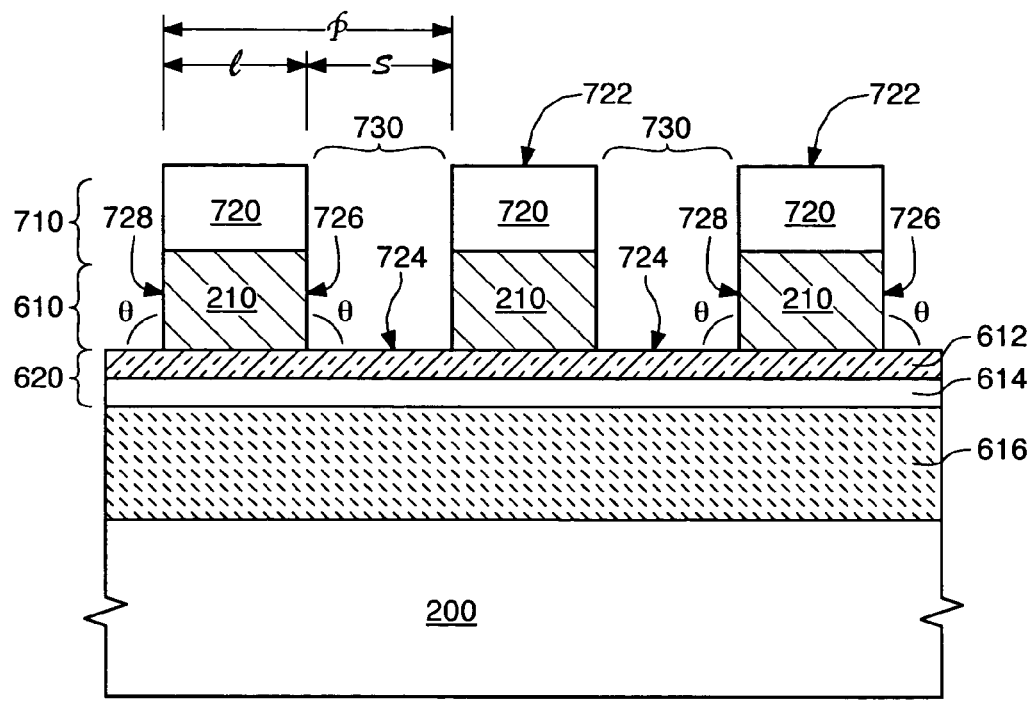
FIG. 9 is a schematic cross-sectional view of the array region of the in-process semiconductor of FIG. 8 after transferring the lines of the photoresist to a sacrificial material according to embodiments of the invention.

Following exposure to an appropriate radiation source through a reticle, unexposed photoresist 710 is removed via methods known in the art, with the remaining photoresist forming lines 720, as shown in FIG. 8. Referring now to FIG. 9, following an etch step utilizing methods known in the art, mask structure 210 is created by extending lines 720 in vertically downward manner into mask 610. Mask structure 210 comprises an upper horizontal surface 722, a lower horizontal surface 724, a first vertical surface 726 and a second vertical surface 728. First vertical surface 726 and second vertical surface 728 create an angle, Θ, approaching 90 degrees with the lower horizontal surface 724. First vertical surface 726, second vertical surface 728 and lower horizontal surface 724 create trench structure 730. The width of trench structure 730 is illustrated by "s" and mask structure 210 width is illustrated by "l" as shown in FIG. 9. The width of mask structure 210 may be from about 50 nm to about 75 nm, more particularly 50 nm may be useful. The width of the trench structure may be from about 125 nm to approximately 150 nm, and more particularly, 150 nm may be useful. Total pitch "P" for the identified structures therefore, is approximately 200 nm which equals the sum of the width of a mask structure 210 and a neighboring trench structure 730 and can be calculated using the formula P=l+s.

Figure 10:
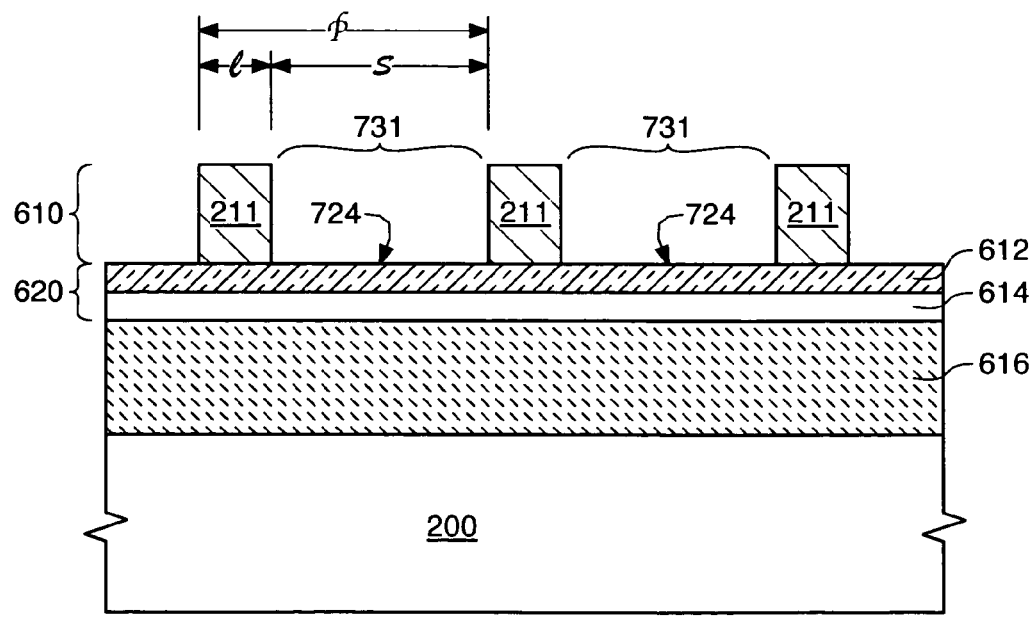
FIG. 10 is a schematic cross-sectional view of the in-process semiconductor of FIG. 9 after removal of the photoresist and an etch step to widen the space between mask structures according to embodiments of the invention.

Referring now to FIG. 10, the remaining photoresist is removed via commonly used methods and mask structure 210 is subjected to an optional etch procedure resulting in a widening of trench structure 730 creating a wider modified trench structure 731, and resulting in a narrower modified mask structure 211. Mask structure 210 is narrowed during the etch process such that the modified width is approximately equivalent to the spacing of the later formed pitch multiplied features. For example, width "l" is decreased by approximately 40% to 60%, and more particularly, by 50%, to approximately 20 nm to 30 nm, and particularly 25 nm is more typical. Width "s" is increased equivalently compared to the reduction of width "l" to about 190 nm to 240 nm, and more particularly to about 225 nm. It will be appreciated that the modification to widths "l" and "s" does not effectively change pitch "P" as described above, as the pitch between modified mask structure 211 and modified trench structure 731 remains about equivalent to the pitch of mask structure 210 and trench structure 730.

Figure 11:
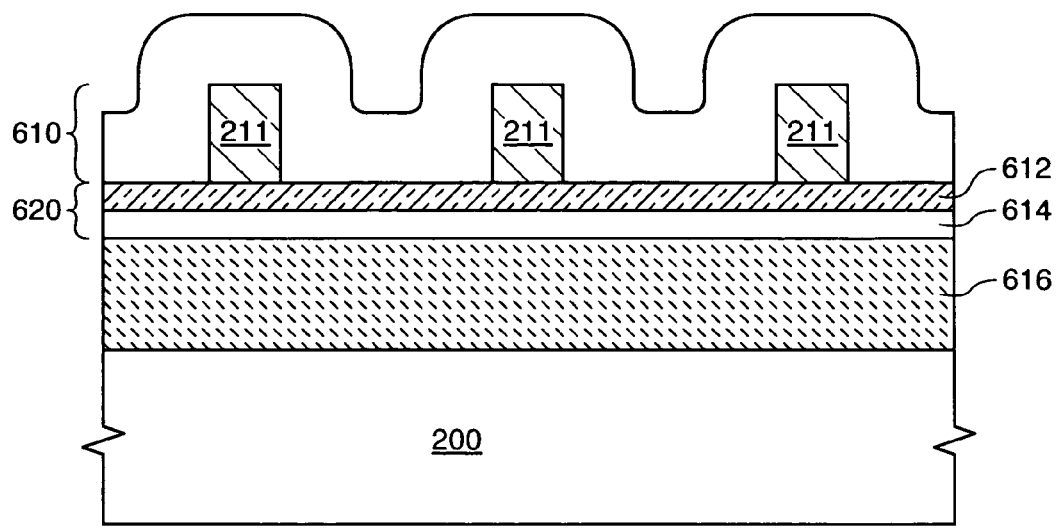
FIG. 11 is a schematic cross-sectional view of the in-process semiconductor of FIG. 10 following deposition of a conformal material according to embodiments of the invention.

Referencing FIG. 11, a conformal spacer material 800 is deposited over exposed surfaces of sacrificial mask 610, including modified mask structure 211 and modified trench structure 731. In one embodiment, the spacer material 800 is deposited via the low temperature ALD process described above and can be of any material capable of being used as a mask for transferring a pattern to hard mask 620, second mask 616 and eventually to substrate 200. It will be appreciated that the number of materials overlying substrate 200 can be more or less than presented here in the described embodiments. As explained above, the low temperature ALD can provide benefits over other types of high temperature material deposition techniques, e.g. CVD, which may be detrimental to reduced feature size fabrication. In one embodiment, the low temperature spacer material 800 is deposited at a temperature a range of about 20 to 90 degrees C., and more particularly temperature in the range of 65 to 78 degrees C., such as 75 degrees C. may be useful. The low temperature ALD process can significantly decrease consumption of sacrificial material 610. Consumption of sacrificial material 610 may result in the degradation of modified mask structure 211, preventing consistent CD transfer to substrate 200 and potentially resulting in decreased operational control of size-reduced features. In an embodiment of the present invention, the spacer material is silicon dioxide and is deposited to a conformal thickness of from about 20 angstroms to 550 angstroms, and more particularly to a thickness of about 420 angstroms to 450 angstroms.

Figure 12:
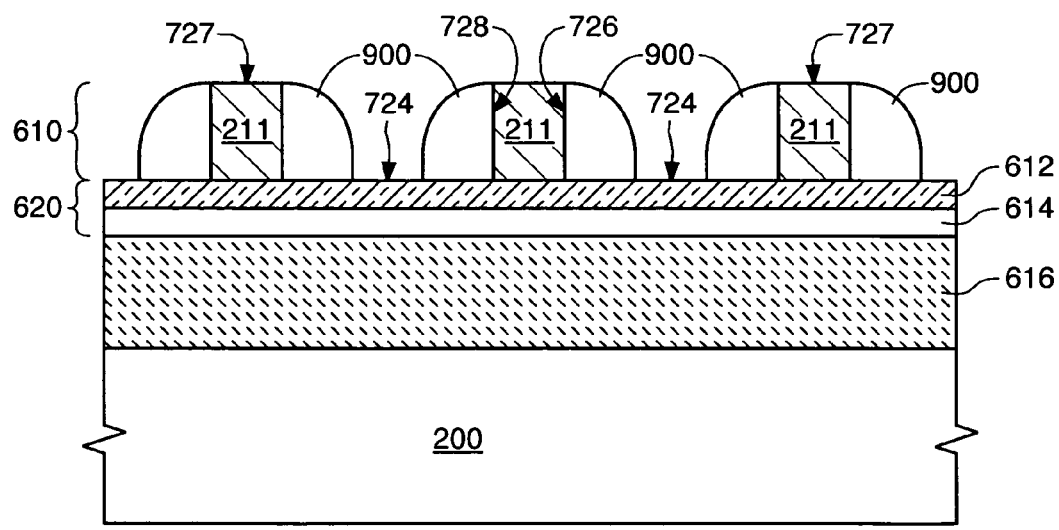
FIG. 12 is a schematic cross-sectional view of the in-process semiconductor of FIG. 11 following formation of a spacer region according to embodiments of the invention.
Figure 13:
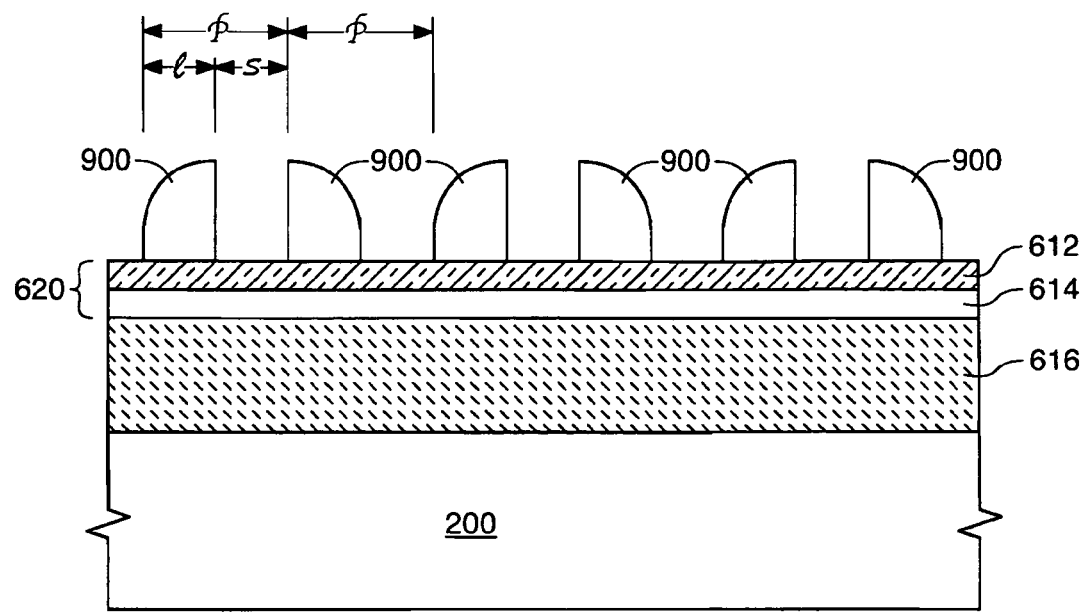
FIG. 13 is a schematic cross-sectional view of the in-process semiconductor of FIG. 12 after directional etching of exposed horizontal surfaces and according to embodiments of the invention.
Figure 14:
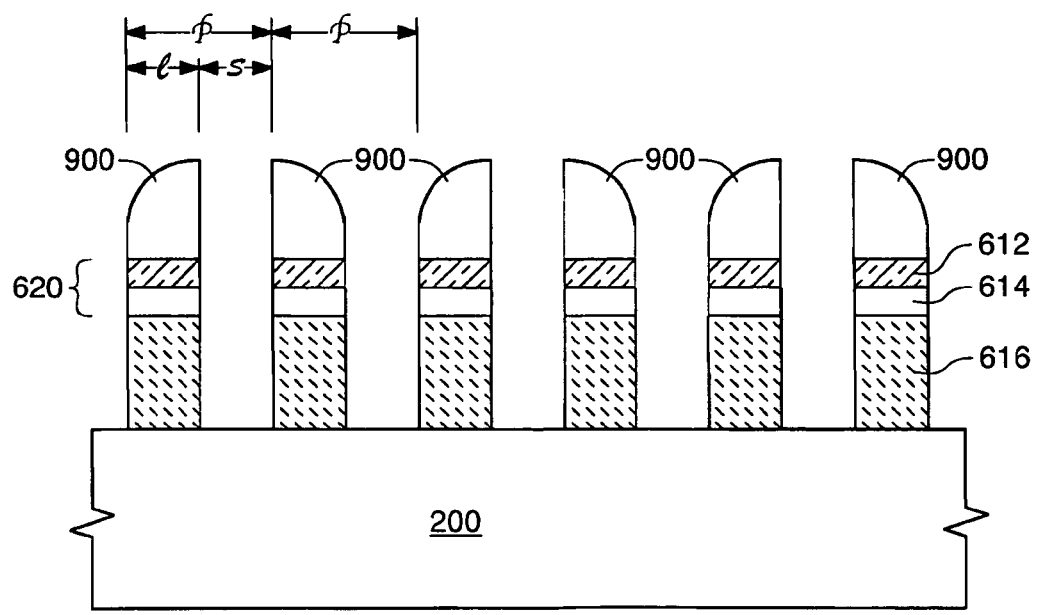
FIG. 14 is a schematic cross-sectional view of the in-process semiconductor of FIG. 13 after transferring the spacer region pattern to other materials adjacent to at least a portion of the in-process semiconductor according to embodiments of the invention.

As illustrated in FIG. 12, the in-process semiconductor undergoes a directional etch for the removal of spacer material 800 from the upper horizontal surface 722 and lower horizontal surface 724, resulting in the formation of a spacer region 900 on vertical surfaces 726 and 728 of modified mask structure 211. The remaining sacrificial material 610 is removed in a subsequent anisotropic etch step, as illustrated in FIG. 13. With the formation of spacer region 900, pitch multiplication has been accomplished, and as illustrated in one embodiment, the pitch has been approximately halved from that capable of being produced through standard photolithography, from about a pitch of 200 nm to a pitch of about 1000 nm, as illustrated by "P" in the figure. Referring to FIG. 14, the reduced feature is subsequently transferred to the hard mask material 620 via a directional etch, subsequently transferring the newly created pitch doubled feature into the second carbon layer 616 via an oxygen based etch, and subsequently into the semiconductor substrate 200.

While this invention has been described with reference to illustrative embodiments, this description is not meant to be construed in a limiting sense. Various modifications and substitution of materials can be made without departing from the spirit or scope of the invention, and will be apparent to persons skilled in the art upon reference to this description. Accordingly, the above description and accompanying drawings are only illustrative of embodiments that can achieve the features and advantages of the present invention. It is not intended that the invention be limited to the embodiments shown and described in detail herein.

We claim:

1. A method of depositing a conformal silicon dioxide in semiconductor fabrication comprising:
   positioning a semiconductor substrate having a sacrificial material adjacent the semiconductor substrate into a deposition region of a deposition apparatus, the semiconductor substrate having a non-planar topography;
   exposing the semiconductor substrate to a first mixture comprising a first reactant and a first catalyst wherein the first reactant is hexachlorodisilane ("HCD") and the first catalyst is pyridine, permitting the formation of a first reactant chemisorbed layer on the semiconductor substrate; and
   exposing the semiconductor substrate to a second mixture comprising a second reactant and a second catalyst wherein the second reactant is a compound containing oxygen and hydrogen and the second catalyst is pyridine, permitting the formation of a silicon dioxide monolayer on the semiconductor substrate; wherein the exposings of the semiconductor substrate to the first mixture and the second mixture do not decompose the sacrificial material.

2. The method of claim 1, further comprising:
   exposing the semiconductor substrate to the first reactant and first catalyst;
   removing excess first reactant and first catalyst from the deposition region;
   purging the deposition region with inert gas;
   exposing the semiconductor substrate to the second reactant and second catalyst;
   removing excess second reactant and second catalyst from the deposition region; and
   purging the deposition region with inert gas.

3. The method of claim 1, wherein the exposings of the semiconductor substrate to the first mixture and the second mixture are is performed at a temperature in a range of about 30° C. to about 90° C.

4. The method of claim 1 wherein the exposings of the semiconductor substrate to the first mixture and the second mixture are is performed at a temperature in a range of about 65° C. to about 80° C.

5. The method of claim 1, wherein the deposition region of the deposition apparatus internal temperature is equalized to a temperature in a range of about 30° C. to about 90° C. prior to the exposings of the semiconductor substrate to the first mixture and second mixture.

6. The method of claim 1, wherein the deposition region of the deposition apparatus internal temperature is equalized to a temperature in a range of about 65° C. to about 80° C. prior to the exposings of the semiconductor substrate to the first mixture and second mixture.

7. The method of claim 1, wherein the deposition region of the deposition apparatus internal temperature is equalized to a temperature in a range of about 30° C. to about 32° C. prior to the exposings of the semiconductor substrate to the first mixture and second mixture.

8. The method of claim 1, wherein the first reactant and first catalyst are introduced into the deposition region of the deposition apparatus at a temperature in a range of about 10° C. to about 90° C.

9. The method of claim 1, wherein the first reactant and first catalyst are introduced into the deposition region of the deposition apparatus at a temperature in a range of about 20° C. to about 60° C.

10. The method of claim 1, wherein the second reactant and second catalyst are introduced into the deposition region of the deposition apparatus at a temperature in a range of about 10° C. to about 90° C.

11. The method of claim 1, wherein the second reactant and second catalyst are introduced into the deposition region of the deposition apparatus at a temperature in a range of about 20° C. to about 60° C.

12. The method of claim 1, wherein the first reactant and first catalyst are introduced into the deposition region of the deposition apparatus at a rate in a range of about 0.1 standard liters per minute ("slm") to about 2.0 slm.

13. The method of claim 1, wherein the first reactant is introduced into the deposition region of the deposition apparatus at a rate in a range of about 0.1 slm to about 0.6 slm.

14. The method of claim 1, wherein the first catalyst is introduced into the deposition region of the deposition apparatus at a rate in a range of about 0.1 slm to about 0.75 slm.

15. The method of claim 1, wherein the second reactant is introduced into the deposition region of the deposition apparatus at a rate in a range of about 0.1 slm to about 3.0 slm.

16. The method of claim 1, wherein the second reactant is introduced into the deposition region of the deposition apparatus at a rate in a range of about 0.1 slm to about 2.0 slm.

17. The method of claim 1, wherein the second catalyst is introduced into the deposition region of the deposition apparatus at a rate in a range of about 0.1 slm to about 2.0 slm.

18. The method of claim 1, wherein the second catalyst is introduced into the deposition region of the deposition apparatus at a rate in a range of about 0.1 slm to about 0.8 slm.

19. The method of claim 1, wherein the depositing a conformal silicon dioxide is performed for approximately 20 to 610 seconds per cycle.

20. The method of claim 1, wherein the depositing a conformal silicon dioxide is performed for approximately 65 to 125 seconds per cycle.

21. The method of claim 1, wherein the sacrificial material adjacent the semiconductor substrate is transparent carbon.

22. The method of claim 1, wherein the sacrificial material adjacent the semiconductor substrate is photoresist.

* * * * *